United States Patent [19]

Hoffman

[11] Patent Number: 4,613,865
[45] Date of Patent: Sep. 23, 1986

[54] RADIATION SOURCE IDENTIFICATION SYSTEM

[75] Inventor: Leonard J. Hoffman, Van Nuys, Calif.

[73] Assignee: ITT Corporation, New York, N.Y.

[21] Appl. No.: 613,930

[22] Filed: May 25, 1984

[51] Int. Cl.⁴ .............................................. G01S 5/02
[52] U.S. Cl. .................................................. 343/417
[58] Field of Search ...................... 455/137, 138, 139; 343/450, 374, 417

Primary Examiner—Theodore M. Blum
Assistant Examiner—John B. Sotomayor
Attorney, Agent, or Firm—T. L. Peterson; J. S. Christopher

[57] ABSTRACT

A system for determining the direction of propagation of and the radio frequency of a source of electromagnetic energy. A frequency scanning compressive receiver detects the frequency of a radiating source at a high scanning rate. Resolution is thus not as good as desired. In this arrangement, a resolution receiver is combined to obtain sources of radiated energy of different frequencies that the compressive receiver cannot distinguish.

2 Claims, 5 Drawing Figures

☒ = SIGNAL OCCURRENCE

A = ACTIVITY INDICATOR

S = COMPUTER SELECTED RESOLUTION SEARCH CELLS

△ = BEAM OF HIGHEST SIGNAL AMPLITUDE

RADIATION SOURCE IDENTIFICATION SYSTEM

BACKGROUND OF THE INVENTION

This invention relates to passive receivers, and more particularly to a system for determining the frequency of and the direction of a radiant energy source.

SUMMARY OF THE INVENTION

In accordance with the system of the present invention, there is provided two frequency scanning receivers, viz. a compressive receiver and a resolution receiver. The compressive receiver identifies sources with a resolution of about 50 KHz. The resolution of the resolution receiver is about 25 KHz. The invention thus combines the higher speed of the compressive receiver with the higher resolution of the resolution receiver.

BRIEF DESCRIPTION OF THE DRAWINGS

In the accompanying drawings which illustrate exemplary embodiments of the present invention.

DESCRIPTION OF THE PREFERRED EMBODIMENT

Figure 1:
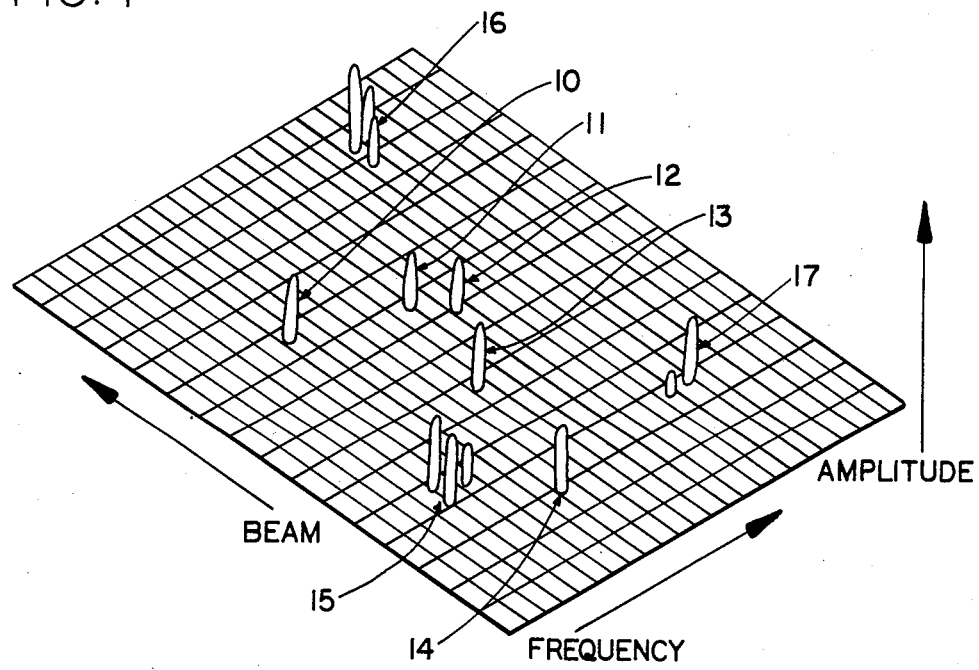
FIG. 1 is a perspective view of a three dimensional graph.

Antenna beams or patterns are illustrated at 10, 11, 12, 13, 14, 15, 16 and 17 in FIG. 1. Patterns 15, 16 and 17 are in clusters. It is possible to determine the existence of a cluster at a more rapid rate by using a faster frequency scanning receiver with less resolution. In accordance with the present invention, a fine resolution receiver is employed in addition to a course resolution (compressive) receiver. The sources of each of the beams in clusters 15, 16 and 17 may thus be identified.

Figure 2:
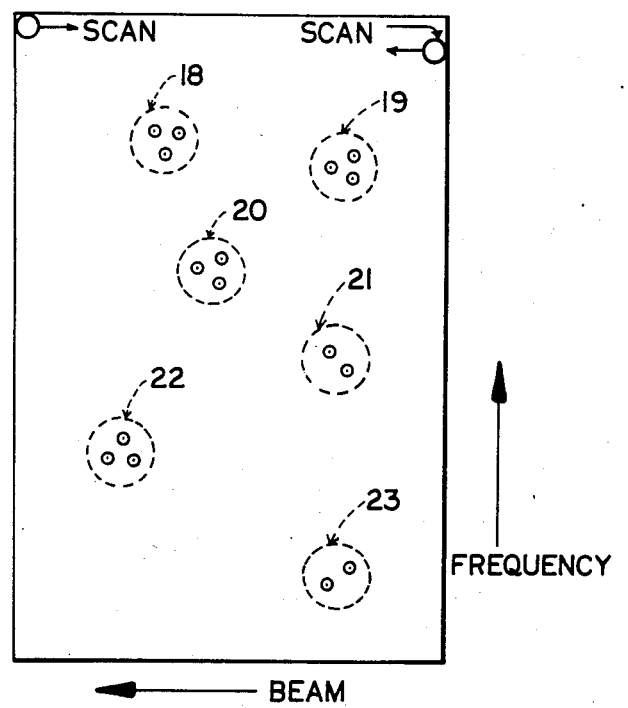
FIG. 2 is a top plan view of a graph similar to the one shown in FIG. 1.

Clusters are again shown in FIG. 2 at 18, 19, 20, 21, 22 and 23.

Figure 3:
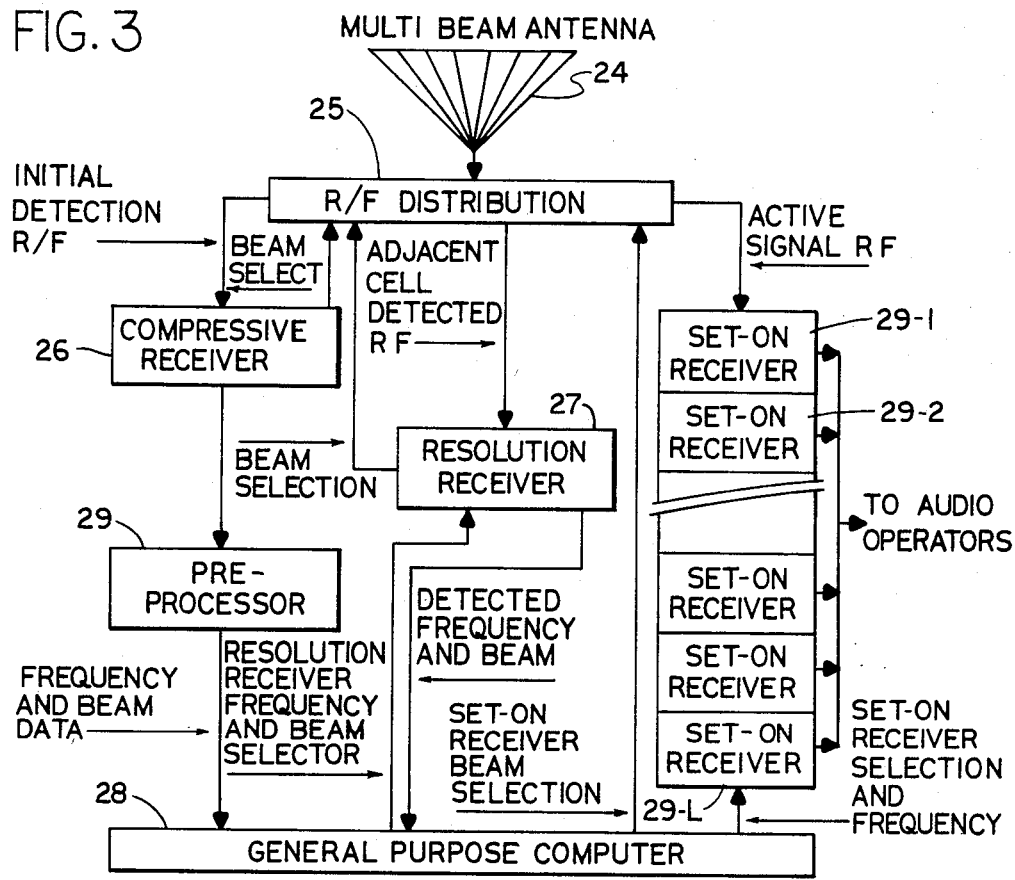
FIG. 3 is a block diagram of one embodiment of the present invention.

In FIG. 3 a multi-beam antenna 24 is shown connected from RF distribution means 25. Antenna 24 may be a conventional antenna such as is made and sold as a Wallenweber. Means 25 is connected to and from a compressive receiver 26 and a resolution receiver 27. Compressive receiver 26 may be of the type described in ITT Gilfillan Technical Memo 742-1 (1975). Resolution receiver 27 may be of the type sold by the Watkins-Johnson Company, Model 8617B. The output of receiver 26 is connected to a general purpose center 28 via a pre-processor 29.

Resolution receiver 27 is connected to and from computer 28. Computer 28 is also connected to means 25 and to set-on receivers 29-1, 29-2 . . . 29-n.

Means 25 also is connected to receivers 29.

OPERATION

The following describes an automatic receiving system employing a mix of receivers to attain a 25 KHz resolution between two simultaneously occurring signals without jeopardizing speed of signal acquisition.

Automated receiving systems become a necessity when the direction of the transmission audio is required including the message content. One method of attaining rapid search of a broad frequency spectrum (VHF and UHF bands) in many different directions and still respond to signal activation within the first syllable of audio response is to use a compressive receiver. Compressive receiver 26 is thus conventional.

Present automatic receiving systems using compressive receivers cannot resolve signals separated by 25 KHz without appreciably slowing down their search time. This would defeat the main purpose of using a compressive receiver in an automatic receiving system which is to ultimately detect first syllable audio response.

The present invention calls for a hybrid receiver system incorporating compressive receiver 26 for high-speed initial signal acquisition and resolution receiver 27 (a digitally-tuned superheterodyne receiver using Log/IF detection) to search rapidly the frequency cells S (FIG. 4) adjacent to active frequency cells A for the resolution accuracy, and a number of digitally-tuned superheterodyne receivers (set-on receivers 29) operating in an AFC mode to be used for setting onto (tuning to and frequency tracking) active signals.

Initial detection of signals are made by the compressive receiver 26 searching all frequencies in 25 KHz frequency steps (or cells) on all directional beams. The detected RF is then processed into specific beams and frequency cells and the information passed on to general purpose computer 28. After verifying signal presence by assigning a set-on receiver to the reported frequency cell, the computer determines which beam to test for adjacent signals. It does this by using the number of beams the signal had been detected on as a measure of signal strength.

The frequency cells on either side of the detected signal's frequency are then passed on to the resolution receiver 27 with beam selection controlled within the resolution receiver 27. The resolution receiver 27 then only scans those frequencies and beams adjacent to currently active signals. If the resolution receiver 27 detects a signal, the frequency and beam is sent to the computer 28 and the computer 28 places additional set-on receiver on that particular frequency and beam.

In this approach then, the three receiver modes (search, resolution and set-on) are combined to form a hybrid receiver system to obtain a 25 KHz frequency resolution.

The signal environment can be typified in a 3-dimensional view as diagrammed in FIG. 1. Frequencies are made up of 25 KHz increments and each increment is divided into m parts associated with multi-beam antenna 24 with m elements. The total number of frequency cells for the VHF (100–160 MHz) and UHF (225–400 MHz) bands to be searched would then total 9,400 frequency cells for each beam element.

The compressive receiver pre-processor 29 is able to designate all beams which the siganl occurred on as active in that frequency cell in order to limit the data processing to the initial detection. To accomplish this, a map of the environment maintained by the pre-processor is provided which contains specific information (activity desired, etc.) for each frequency cell and beam (or group of beams).

The pre-processor 29 at a minimum performs beam selectivity, beam optimization, and initial signal reportage to the computer 28.

Signals detected by the compressive receiver 26 are mapped in the pre-processor 29, beam optimized and the optimum beam and beams of occurrence sent to the computer 28.

Figure 4:
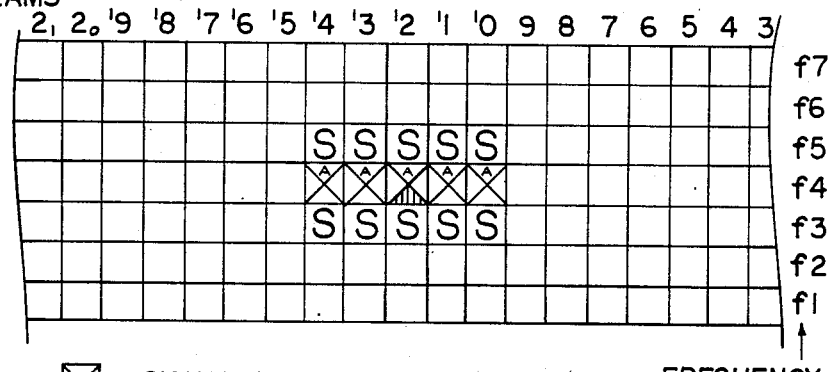
FIG. 4 is a diagrammatic view of a search profile of a resolution receiver.

FIG. 4 shows a sample frequency/beam cell pattern with an active signal appearing in 5 beams on one frequency. The computer 28 then directs one set-on receiver 29 to the reported optimum beam and frequency and directs the audio to an operator when an active status is received for FCC monitoring or otherwise. The computer 28, based on the number of beams the signal appears on, determines how many and which beams to have the resolution receiver 27 search, and commands it to those beams on the adjacent frequency cells.

The resolution receiver 27 has a capability of making Log/IF detections of signals passing a selectable audio threshold. This mode of operation allows rapid scanning of multiple frequencies. The computer 28 passes it a list of frequencies and beams to search for signal occurrences. The list is continually updated as signal activity detected by the compressive receiver 27/set-on receivers 29 dictate.

When the resolution receiver 27 detects a signal, the computer 28 then places a new set-on receiver 29 onto that beam and frequency, makes multiple beam connections to optimize to the strongest signal amplitude, blanks those cells out in the compressive receiver clutter map and determines the new resolution receiver scanning frequencies and beams.

The set-on receivers 29 are also digitally-tuned superheterodyne receivers which report signal activity in a status word to the computer 28. The number of set-on receivers 29 employed in the system is determined by the expected environmental signal activity.

Figure 5:
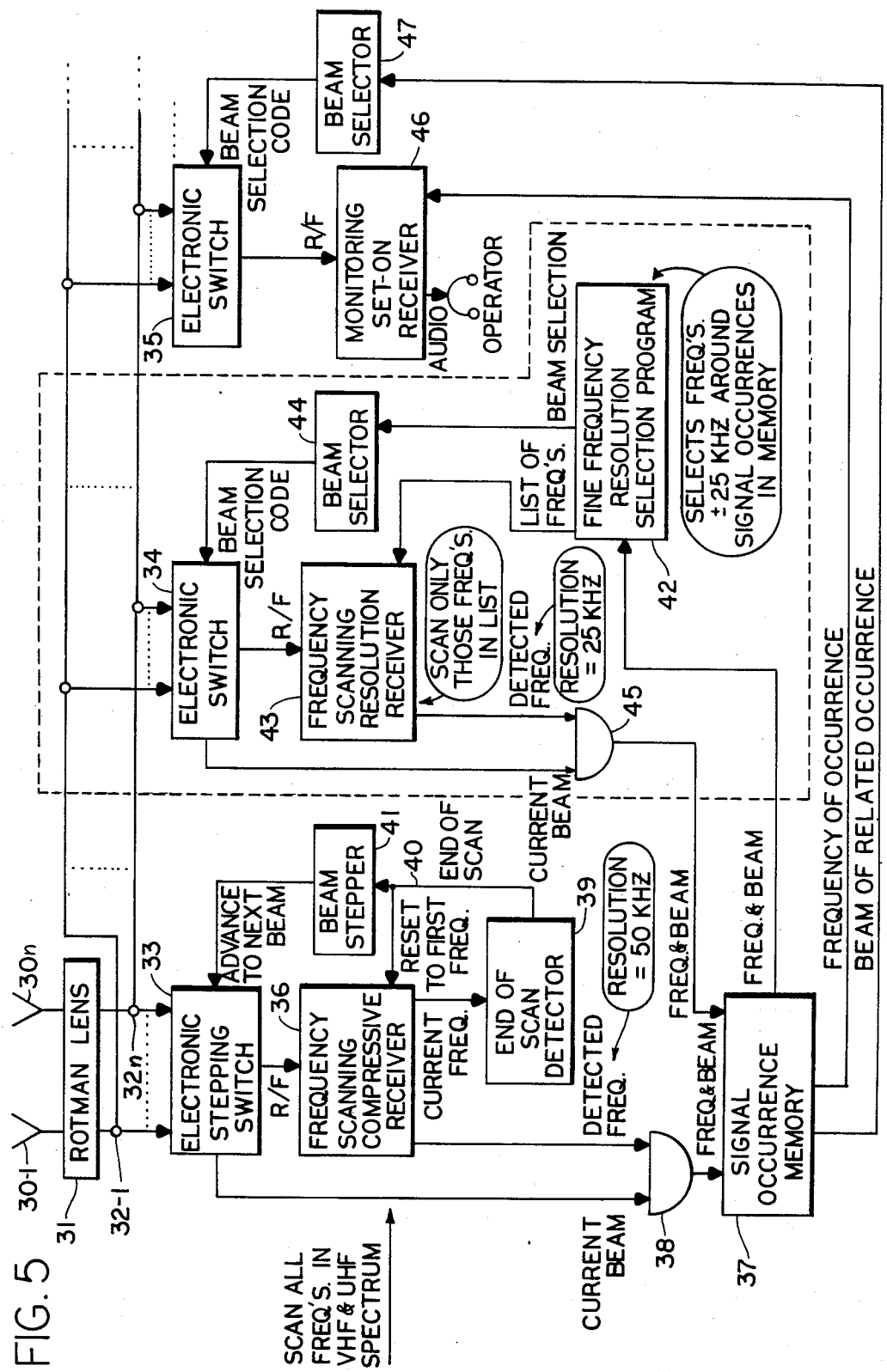
FIG. 5 is a more detailed block diagram of a system constructed in accordance with the present invention.

An alternative embodiment of the present invention is shown in FIG. 5 including antenna elements 30-1, . . . 30-n having a conventional Rotman lens 31 connected therefrom. Plural beam ports 32-1 . . . 32-n are connected from Rotman lens 31 to electronic switches 33, 34 and 35.

A compressive receiver 36 is connected from switch 33 to memory 37 via a gate 38. Receiver 36 is also connected to an end of scan detector 39. Detector 39 has an output 40 connected to receiver 36 and a beam stepper 41.

Frequency and beam direction information is supplied to a high resolution search program 42 by memory 37. Program 42, in turn, guides a resolution receiver 43 and a beam selector 44. Switch 34 is connected to receiver 43 and a gate 45 from beam selector 44.

Memory 37 also controls a set-on receiver 46 and a beam selector 47. Beam selector 47 controls switch 35. The output of switch 35 is connected to receiver 46.

What is claimed is:

1. A system for determining the frequency of and location of a radiating source of electromagnetic energy, said system comprising: receiving antenna means including a plurality of beam ports; an electronic stepping switch connected from said beam ports; a course frequency scanning compressive receiver having an input connected from said electronic stepping switch; first means to cause said compressive receiver to scan repeatedly over a predetermined frequency band; second means to operate said stepping switch to shift the input of said compressive receiver from one beam port to the next for each frequency scan thereof; third means to store beam location and frequency signals detected by said compressive receiver; a frequency scanning resolution receiver for repeatedly scanning a band of frequencies at a rate slower than the scanning rate of said compressive receiver; a second electronic switch connected from said beam ports to said resolution receiver; and means, responsive to said means to store, to program a search through said second switch and said resolution receiver at said slower frequency scan rate to increase resolution in the vicinity of sources discovered by said compressive receiver.

2. The invention as defined in claim 1, wherein a third electronic switch is connected from said beam ports, and a monitoring set-on receiver is connected from said third electronic switch to track signals of sources with identified frequencies and locations.

* * * * *